(12) United States Patent
Han et al.

(10) Patent No.: US 10,003,038 B2
(45) Date of Patent: Jun. 19, 2018

(54) ORGANIC LIGHT-EMITTING ELEMENT

(71) Applicant: LG DISPLAY CO., LTD., Seoul (KR)

(72) Inventors: Mi-Young Han, Paju-si (KR); Hongseok Choi, Seoul (KR); Taesun Yoo, Goyang-si (KR); JungSoo Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days. days.

(21) Appl. No.: 15/220,117

(22) Filed: Jul. 26, 2016

(65) Prior Publication Data

US 2017/0092888 A1 Mar. 30, 2017

(30) Foreign Application Priority Data

Sep. 30, 2015 (KR) ........................ 10-2015-0137556

(51) Int. Cl.
*H01L 51/50* (2006.01)
(52) U.S. Cl.
CPC .......... *H01L 51/504* (2013.01); *H01L 51/508* (2013.01); *H01L 51/5012* (2013.01); *H01L 51/5044* (2013.01); *H01L 51/5004* (2013.01); *H01L 51/5056* (2013.01); *H01L 51/5072* (2013.01); *H01L 2251/5384* (2013.01); *H01L 2251/552* (2013.01); *H01L 2251/558* (2013.01)
(58) Field of Classification Search
CPC ... H01L 51/50; H01L 51/5012; H01L 51/504; H01L 51/5044; H01L 51/508; H01L 2251/5384; H01L 2251/552; H01L 2251/558; H01L 51/5004; H01L 51/5056; H01L 51/5072

See application file for complete search history.

(56) References Cited

U.S. PATENT DOCUMENTS

2006/0043885 A1\* 3/2006 Poplavskyy ........ H01L 51/5036
313/506
2014/0124766 A1 5/2014 Song et al.

FOREIGN PATENT DOCUMENTS

CN 103811531 A 5/2014

\* cited by examiner

*Primary Examiner* — Thanh T Nguyen
(74) *Attorney, Agent, or Firm* — Birch, Stewart, Kolasch & Birch, LLP

(57) ABSTRACT

Discussed herein is an organic light-emitting device capable of increasing luminous efficiency and panel efficiency while improving color gamut. The organic light-emitting device includes a red organic light emitting layer including a single host material of hole transport type and a yellow-green organic light emitting layer including a plurality of host materials in a light-emitting stack. Instead of using an additional host material for the organic light emitting layers, the material of the electron transport layer and the material of the hole transport layer is used as the host material of the yellow-green organic light emitting layer, and the material of the hole transport layer is used as the host material of the red organic light emitting layer. Accordingly, the number of materials of the organic light emitting layers is reduced, such that the fabricating process becomes simpler.

10 Claims, 10 Drawing Sheets

FIG. 6

| | DRIVING VOLTAGE (V) | LUMINOUS EFFICIENCY (cd/A) | EXTERNAL QUANTUM EFFICIENCY (%) | x-CHROMATICITY COORDINATE | y-CHROMATICITY COORDINATE |
|---|---|---|---|---|---|
| COMPARATIVE EXAMPLE 1 | 3.8 | 53.7 | 19.6 | 0.485 | 0.506 |
| EXAMPLE 1 | 3.9 | 57.2 | 19.8 | 0.477 | 0.514 |

| | DRIVING VOLTAGE (V) | LUMINOUS EFFICIENCY (cd/A) | x-CHROMATICITY COORDINATE | y-CHROMATICITY COORDINATE |
|---|---|---|---|---|
| COMPARATIVE EXAMPLE 2 | 12.6 | 70.8 | 0.305 | 0.280 |
| EXAMPLE 2 | 12.8 | 71.9 | 0.304 | 0.283 |

FIG. 10

ORGANIC LIGHT-EMITTING ELEMENT

CROSS-REFERENCE TO RELATED APPLICATIONS

This application claims the priority of Korean Patent Application No. 10-2015-0137556 filed on Sep. 30, 2015, in the Korean Intellectual Property Office, the disclosure of which is incorporated herein by reference.

BACKGROUND

Technical Field

The present disclosure relates to an organic light-emitting device, and more specifically to an organic light-emitting device that has a simple structure and thus is easily fabricated, while improving color gamut, luminous efficiency and lifespan.

Description of the Related Art

As the era of information technology has begun, the field of display that represents electrical information signals graphically has been rapidly growing. In accordance with this trend, various display devices which are thinner, lighter and consume less power have been developed.

Such display devices include a liquid crystal display (LCD) device, a plasma display panel (PDP) device, a field emission display (FED) device, and an organic light emitting display (OLED) device, etc.

In particular, organic light-emitting display devices have advantages over other display devices in that they are self-luminous and that they have fast response speed, high luminous efficiency, high brightness and wide viewing angle.

An organic light-emitting device has a fundamental structure in which an organic light emitting layer is disposed between two electrodes. Electrons and holes are injected into the organic light emitting layer from the two electrodes, respectively. The electrons and the holes recombine in the organic light emitting layer to generate excitons. Light is emitted from the organic light-emitting device when the excitons transition from an excited state to the ground state.

SUMMARY

An organic light-emitting device may be an element of each of sub-pixels emitting light of red (R), green (G) and blue (B). A pixel includes such sub-pixels each including an organic light-emitting device to thereby produce full color. The light emitted from each of the sub-pixels emitting light of red (R), green (G) and blue (B) has its own chromaticity coordinates corresponding to red (R), green (G) and blue (B) colors. A color gamut of a pixel can be represented from the chromaticity coordinates corresponding to the red (R), green (G) and blue (B) colors. Each light emitted from an organic light-emitting device has its own chromaticity coordinates, which is determined by the material of an organic light emitting layer. The color gamut is a key factor that determines the quality of an OLED device.

On the other hand, the luminous efficiency of an organic light-emitting device is a key factor that determines the lifespan of an OLED device. In the case that an organic light emitting layer of an organic light-emitting device is made of a phosphorescent material, triplet excitons contribute to emission, and thus the organic light-emitting device exhibits higher luminous efficiency than the case that the organic light emitting layer is made of a fluorescent material.

To meet the market demands toward display devices with good quality and long lifespan, research into organic light-emitting devices with good color gamut and high luminous efficiency is ongoing.

To achieve good color gamut and high luminous efficiency simultaneously, however, the structure of organic light-emitting devices may become complicated. As a result, the fabricating process of an OLED device becomes complicated. Complicated fabricating process results in low production yield of OLED devices, and the production cost of OLED devices cannot be reduced.

In view of the above problems recognized by the present inventors, an object of the present disclosure is to provide an organic light-emitting device that has good color gamut and high luminous efficiency by way of disposing organic light emitting layers emitting light of different colors in a single light-emitting stack.

Another object of the present disclosure is to provide an organic light-emitting device that has a simple structure by way of forming a host material of an organic light emitting layer with the same material as the material of an electron transport layer or a hole transport layer, instead of using an additional material.

Another object of the present disclosure is to provide an organic light-emitting device that has a simple structure while exhibiting good color gamut, high luminous efficiency and long lifespan, such that the fabricating process becomes simple and the production yield can be improved.

Another object of the present disclosure is to provide an organic light-emitting device that has good interfacial properties for charge movement in such a manner that an organic light emitting layer and an electron transport layer, or an organic light emitting layer and a hole transport layer share the same material.

It should be noted that objects of the present disclosure are not limited to the above-described objects, and other objects of the present disclosure will be apparent to those skilled in the art from the following descriptions.

An organic light-emitting device capable of increasing luminous efficiency and panel efficiency while improving color gamut is provided in the present disclosure. Such an organic light-emitting device includes a red organic light emitting layer including a single host material of hole transport type and a yellow-green organic light emitting layer including a plurality of host materials in a light-emitting stack. Instead of using an additional host material for the organic light emitting layers, the material of the electron transport layer and the material of the hole transport layer is used as the host material of the yellow-green organic light emitting layer, and the material of the hole transport layer is used as the host material of the red organic light emitting layer. Accordingly, the number of materials of the organic light emitting layers is reduced, such that the fabricating process becomes simpler. In addition, the organic light-emitting device with good color gamut, high luminous efficiency and long lifespan can be implemented.

According to an exemplary embodiment of the present disclosure, an organic light-emitting device includes: a first hole transport layer made of a first material of hole transport type; a first electron transport layer made of a second material of electron transport type; a first organic light emitting layer between the first electron transport layer and the first hole transport layer and comprising the first material and the second material as a plurality of host materials; and a second organic light emitting layer between the first organic light emitting layer and the first hole transport layer and comprising the first material as a single host material. A wavelength of light emitted from the second organic light emitting layer is longer than a wavelength of light emitted from the first organic light emitting layer.

According to another exemplary embodiment of the present disclosure, an organic light-emitting device includes: a first hole transport layer and a first electron transport layer facing each other; and a first organic light emitting layer and a second organic light emitting layer between the first hole transport layer and the first electron transport layer. The first organic light emitting layer and the second organic light emitting layer share a host material and are configured to emit light of different colors. The host material is the same as a material of the first hole transport layer.

Particulars in the exemplary embodiments of the present disclosure will be described in the detail description with reference to the accompanying drawings.

According to an exemplary embodiment of the present disclosure, an organic light-emitting device that has good color gamut and high luminous efficiency can be provided by way of disposing organic light emitting layers emitting light of different colors in a single light-emitting stack.

According to an exemplary embodiment of the present disclosure, an organic light-emitting device that has a simple structure can be provided by way of forming a host material of an organic light emitting layer with the same material as the material of an electron transport layer or a hole transport layer, instead of using an additional material.

According to an exemplary embodiment of the present disclosure, an organic light-emitting device that has a simple structure while exhibiting good color gamut, high luminous efficiency and long lifespan can be provided, such that the fabricating process becomes simple and the production yield can be improved.

According to an exemplary embodiment of the present disclosure, an organic light-emitting device that has good interfacial properties for charge movement can be provided in such a manner that an organic light emitting layer and an electron transport layer, or an organic light emitting layer and a hole transport layer share the same material.

It should be noted that effects of the present disclosure are not limited to those described above and other effects of the present disclosure will be apparent to those skilled in the art from the following descriptions.

The Summary is not to specify essential features of the appended claims, and thus the scope of the claims is not limited thereby.

BRIEF DESCRIPTION OF THE DRAWINGS

The above and other aspects, features and other advantages of the present disclosure will be more clearly understood from the following detailed description taken in conjunction with the accompanying drawings, in which:

FIG. 6 is a table showing test results of the element according to Example 1 and the element according to Comparative Example 1;

FIG. 10 is a table showing test results of the element according to Example 2 and the element according to Comparative Example 2.

DETAILED DESCRIPTION OF THE EMBODIMENTS

Figure 1:
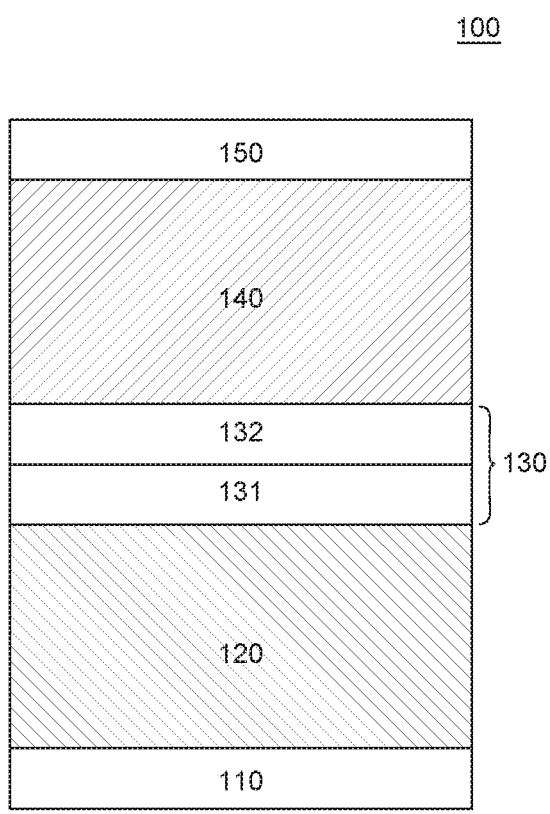
FIG. 1 is a cross-sectional view of the structure of an organic light-emitting device according to an exemplary embodiment of the present disclosure.

Advantages and features of the present disclosure and methods to achieve them will be elucidated from various exemplary embodiments described below in detail with reference to the accompanying drawings. However, the present disclosure is not limited to various exemplary embodiments disclosed herein but may be implemented in various different ways. The exemplary embodiments are provided for making the disclosure of the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. These terms are used to merely distinguish one element from another. Accordingly, as used herein, a first element may be a second element within the technical idea of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

As used herein, a lowest unoccupied molecular orbitals (LUMO) energy level and a highest occupied molecular orbitals (HOMO) energy level of a layer refers to the LUMO energy level and the HOMO energy level of a host material of the layer, unless the recitation explicitly states the LUMO energy level and the HOMO energy level of a dopant material of the layer.

As used herein, an electroluminescence (EL) spectrum is calculated by multiplying photoluminescence (PL) spectrum exhibiting characteristics of a luminous material by emittance spectrum exhibiting outcoupling that changes depending on the thickness and optical properties of an organic layer such as an electron transport layer. As used herein, an EL spectrum is obtained by measuring light emitted from an organic light-emitting device on a front surface of the organic light-emitting device (i.e., at the viewing angle of 0 degree), unless specifically stated otherwise.

As used herein, a light-emitting stack refers to a unit structure including organic layers such as an electron transport layer and a hole transport layer, and an organic light emitting layer disposed between the electron transport layer and the hole transport layer. The organic layers may include an electron injection layer, a hole injection layer and a hole blocking layer, which form the light-emitting stack, and may include other organic layers depending on the structure or design of the organic light-emitting device.

Hereinafter, exemplary embodiments of the present disclosure will be described in detail with reference to the accompanying drawings.

FIG. 1 is a cross-sectional view for illustrating the structure of an organic light-emitting device according to an exemplary embodiment of the present disclosure. All the components of the organic light-emitting device according to all embodiments of the present disclosure are operatively coupled and configured.

Referring to FIG. 1, an organic light-emitting device 100 according to an exemplary embodiment of the present disclosure has a two-stack structure. In the structure, a first light-emitting stack 120 and a second light-emitting stack 140 are disposed between a first electrode 110 and a second electrode 150. In addition, a charge generation layer (CGL) 130 is disposed between the first light-emitting stack 120 and the second light-emitting stack 140. In other words, the organic light-emitting device 100 includes the first electrode 110, the first light-emitting stack 120, the charge generation layer 130, the second light-emitting stack 140 and the second electrode 150.

The first electrode 110 is an anode that supplies holes to the first light-emitting stack 120. The first electrode 110 may be made of a transparent conductive material having a high work function. For example, the first electrode 110 may be made of, but is not limited to, a transparent conductive material such as tin oxide (TO), indium tin oxide (ITO), indium zinc oxide (IZO), indium tin zinc oxide (ITZO), etc. In some embodiments of the present disclosure where the organic light-emitting device 100 is employed by a top emission OLED device, the organic light-emitting device 100 may include a reflective layer made of highly reflective material such as silver (Ag) or a silver alloy under the first electrode 110.

The second electrode 150 is a cathode that supplies electrons to the second light-emitting stack 140. The second electrode 150 may be made of a material having a low work function. For example, the second electrode 150 may be made of a transparent conductive oxide (TCO) such as indium tin oxide (ITO), indium zinc oxide (IZO), indium gallium zinc oxide (IGZO), etc. Alternatively, the second electrode 150 may be made of at least one selected from the group consisting of opaque conductive metals such as magnesium (Mg), silver (Ag), aluminum (Al) and calcium (Ca), and an alloy thereof. For example, the second electrode 150 may be made of an alloy of magnesium and silver (Mg:Ag). Alternatively, the second electrode 150 may be made up of, but is not limited to, two layers, one layer made of a transparent conductive oxide (TCO) such as indium tin oxide (ITO), indium zinc oxide (IZO) and indium gallium zinc oxide (IGZO), and the other layer made of a metal material such as gold (Au), silver (Ag), aluminum (Al), molybdenum (Mo), magnesium (Mg), etc.

In the case that the organic light-emitting device 100 is employed by a top emission OLED device, the second electrode 150 may have a transparent or transflective property such that light generated in the first light-emitting stack 120 and the second light-emitting stack 140 passes through the second electrode 150 to exit.

The first light-emitting stack 120 emits light and is disposed between the first electrode 110 and the charge generation layer 130. Hereinafter, the first light-emitting stack 120 according to an exemplary embodiment of the present disclosure will be described in detail with reference to FIGS. 2 to 4.

Figure 2:
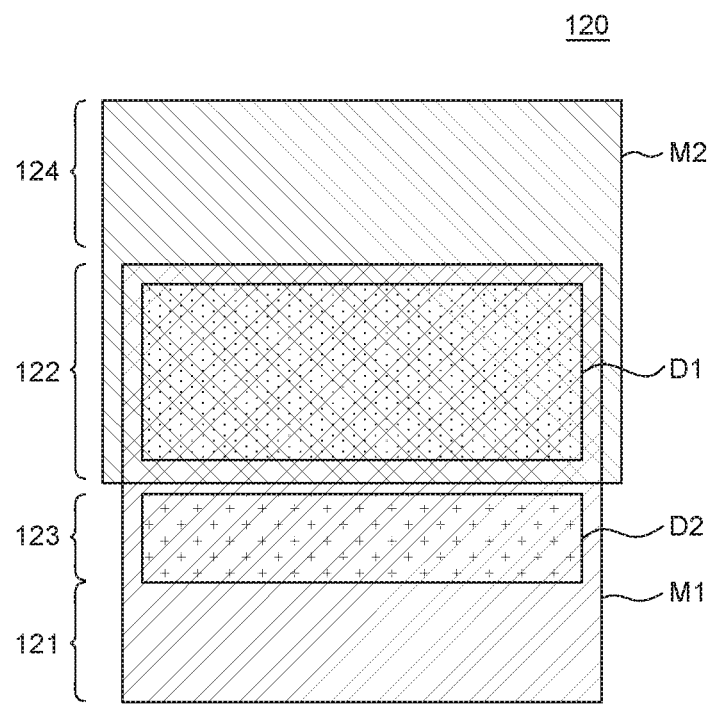
FIGS. 2 to 4 are cross-sectional views of the structure of a first stack according to exemplary embodiments of the present disclosure.
Figure 3:
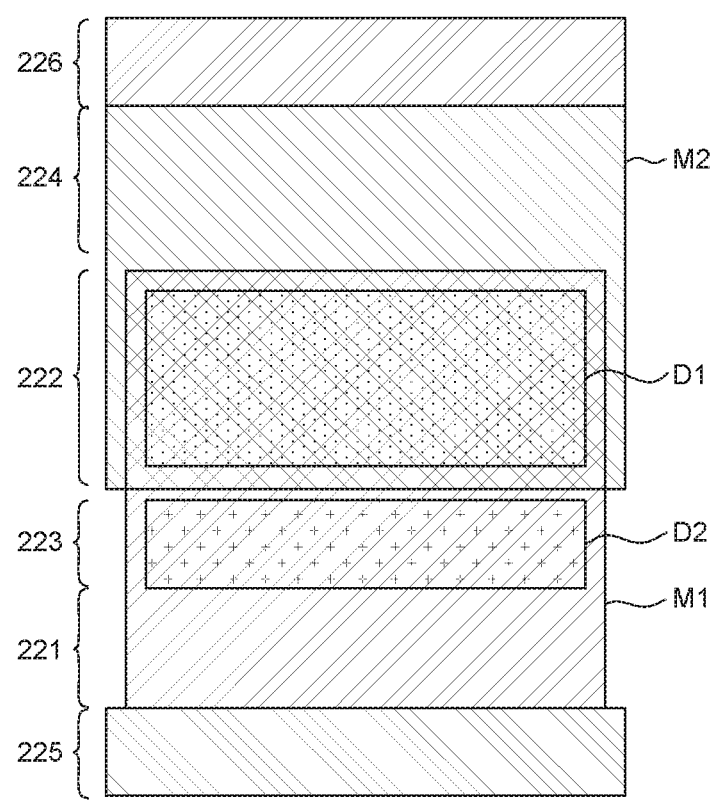
Figure 4:
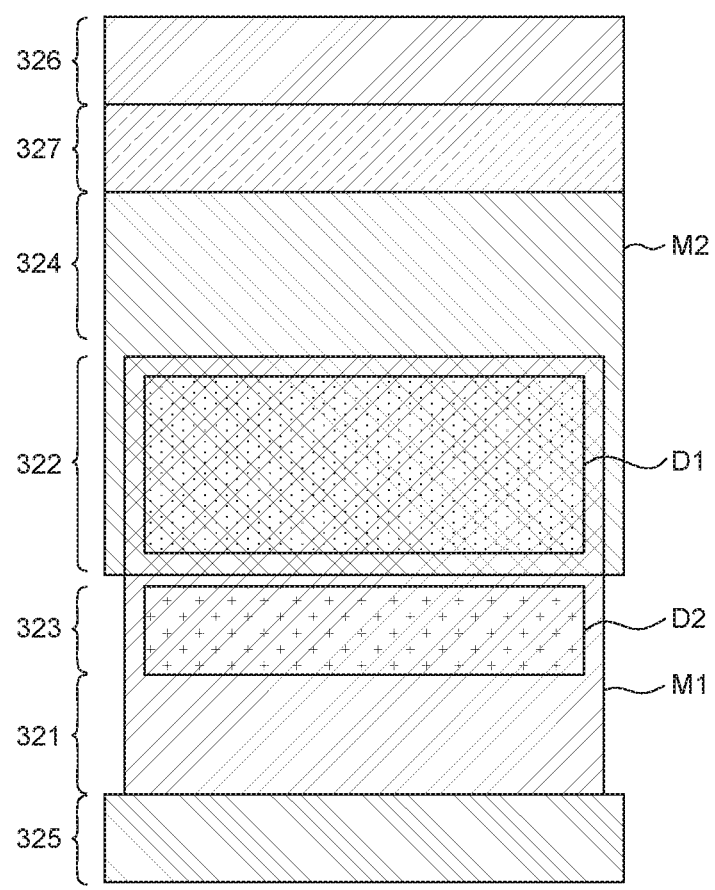

FIGS. 2 to 4 are cross-sectional views of the structure of the first light-emitting stack 120 according to exemplary embodiments of the present disclosure.

FIG. 2 shows a structure of the first light-emitting stack 120 included in the organic light-emitting device 100 according to an exemplary embodiment of the present disclosure. Referring to FIG. 2, the first light-emitting stack 120 includes a first hole transport layer (HTL) 121 disposed on the first electrode 110, a second organic light emitting layer (EML) 123 disposed on the first hole transport layer 121, a first organic light emitting layer 122 disposed on the second organic light emitting layer 123, and a first electron transport layer (ETL) 124 disposed on the first organic light emitting layer 122.

Each of the first organic light emitting layer 122 and the second organic light emitting layer 123 may have a host-dopant system, in which a host material having a large weight ratio is doped with a luminous dopant material at a weight ratio of 2% to 20%, i.e., a small amount of the luminous dopant material.

The first hole transport layer 121 receives holes from the first electrode 110. The first hole transport layer 121 delivers the received holes to the first organic light emitting layer 122 and the second organic light emitting layer 123. The first hole transport layer 121 may be made of a first material M1. The first material M1 is a hole-transport-type material. Specifically, a hole-transport-type material has a hole mobility of $1.0*10^{-3}$ cm$^2$/V·s or higher and becomes electrochemically stable as it is cationized, i.e., loses electrons. In other words, a hole-transport-type material generates stable radical cations. Namely, the first material M1 has a high hole mobility, i.e., holes move fast therein such that the first hole transport layer 121 can transport holes to the first organic light emitting layer 122 and the second organic light emitting layer 123 quickly. Alternatively, the first material M1 includes aromatic amine such that it can be easily cationized.

For example, the HOMO energy level of the first material M1 ranges from −5.3 eV to −5.0 eV, and the LOMO energy level of the first material M1 ranges from −2.0 eV to −1.8 eV. Alternatively, the energy gap Eg of the first material M1 may range from 3.0 eV to 3.5 eV such that it does not absorb visible ray.

For example, the first material M1 may be made of, but is not limited to, one of NPD(N,N-dinaphthyl-N,N'-diphenyl-benzidine) (N,N'-bis(naphthalen e-1-yl)-N,N'-bis(phenyl)-2,2'-dimethylbenzidine), TPD(N,N'-bis-(3-methylphenyl)-N,N'-bis-(phenyl)-benzidine), spiro-TAD(2,2',7,7'-tetrakis(N, N-dimethylamino)-9,9-spirofluorene) and MTDATA (4,4',4-Tris(N-3-methylphenyl-N-phenyl-amino)-triphenylamine).

The first electron transport layer 124 receives electrons from an n-type charge generation layer 131 to be described below. The first electron transport layer 124 delivers the received electrons to the first organic light emitting layer 122 and the second organic light emitting layer 123. The first electron transport layer 124 may be made of a second material M2. The second material M2 is an electron-transport-type material. Specifically, an electron-transport-type material has an electron mobility of $1.0*10-6$ cm$^2$/V·s or higher and becomes electrochemically stable as it is anionized, i.e., gains electrons. In other words, an electron-transport-type material generates stable radical anions. Namely, the second material M2 has a high electron mobility, i.e., electrons move fast therein such that the first electron transport layer 124 can transport electrons to the first organic light emitting layer 122 and the second organic light emitting layer 123 quickly. Alternatively, the second material M2 includes heterocyclic ring such that it can be easily anionized by hetero atoms.

For example, the HOMO energy level of the second material M2 ranges from −5.6 eV to −5.3 eV, and the LOMO energy level of the second material M2 ranges from eV to −2.5 eV. Alternatively, the energy gap Eg of the second material M2 may range from 2.5 eV to 3.0 eV such that it does not absorb visible ray.

For example, the second material M2 may be made of, but is not limited to, one of Alq3(tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ (3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi (2,2',2-(1,3,5-benzinetriyl)-tris(1-phenyl-1-H-benzimidazole), oxadiazole, triazole, phenanthroline, benzoxazole or benzthiazole.

The first organic light emitting layer 122 and the second organic light emitting layer 123 are disposed between the first hole transport layer 121 and the first electron transport layer 124. The first organic light emitting layer 122 and the second organic light emitting layer 123 are disposed in a portion of the first light-emitting stack 120 where excitons are formed. Each of the first organic light emitting layer 122 and the second organic light emitting layer 123 contains a material emitting light of a particular color. Each of the first organic light emitting layer 122 and the second organic light emitting layer 123 may include, but is not limited to, a luminous material that emits red light, green light, blue light or yellow-green light. For example, the first organic light emitting layer 122 may emit yellow-green light, the second organic light emitting layer 123 may emit red light, and the third organic light emitting layer (to be described later) may emit blue light, such that the organic light-emitting device 100 may produce white light.

The first organic light emitting layer 122 includes a plurality of host materials, and the second organic light emitting layer 123 includes a single host material. For example, the first organic light emitting layer 122 may include the first material M1 and the second material M2 as the plurality of host materials, and the second organic light emitting layer 123 may include the first material M1 as the single host material. In this case, the material of the first hole transport layer 121 may be the same as one of the plurality of host materials of the first organic light emitting layer 122. In other words, the material of the first hole transport layer 121 may be the first material M1 and one of the plurality of host materials of the first organic light emitting layer 122 may be the first material M1 as well. In addition, the material of the first hole transport layer 121 may be the same as the single host material of the second organic light emitting layer 123. In other words, the material of the first hole transport layer 121 may be the first material M1 and the single host material of the second organic light emitting layer 123 may be the first material M1 as well. In addition, one of the plurality of host materials of the first organic light emitting layer 122, the single host material of the second organic light emitting layer 123 and the material of the first hole transport layer 121 may be the same. In other words, one of the plurality of host materials of the first organic light emitting layer 122 may be the first material M1, the single host material of the second organic light emitting layer 123 may be the first material M1, and the material of the first hole transport layer 121 may also be the first material M1.

Namely, the first organic light emitting layer 122, which is closer to the first electron transport layer 124 than the second organic light emitting layer 123, includes both of the first material M1 of the first hole transport layer 121 and the second material M2 of the first electron transport layer 124. In other words, the first organic light emitting layer 122 includes both of the hole-transport-type host material and the electron-transport-type host material. The first material M1 may be included in the first organic light emitting layer 122 as the hole-transport-type host material. The second material M2 may be included in the first organic light emitting layer 122 as the electron-transport-type host material. The first organic light emitting layer 122 including the plurality of host materials is doped with a small amount of a first dopant material D1.

On the other hand, the second organic light emitting layer 123, which is closer to the first hole transport layer 121 than the first organic light emitting layer 122, includes the first material M1 of the first hole transport layer 121 but not the second material M2 of the first electron transport layer 124. In other words, the second organic light emitting layer 123 includes the hole-transport-type host material only. The first material M1 may be included in the second organic light emitting layer 123 as the hole-transport-type host material. The second organic light emitting layer 123 including the single host material is doped with a small amount of a second dopant material D2.

The first light-emitting stack 120 may emit yellow-green light or yellow-green light together with red light and the second light-emitting stack 140 may emit blue light, such that the light emitted from the first light-emitting stack 120 and the light emitted from the second light-emitting stack 140 are mixed to produce white light. In other words, the EL spectrum of the light emitted from the first light-emitting stack 120 may have a first peak in the range of yellow-green wavelength or may have a second peak in the range of red wavelength. The EL spectrum of the light emitted from the second light-emitting stack 120 may have a third peak in the range of blue wavelength.

For example, the first organic light emitting layer 122 may emit yellow-green light, and the second organic light emitting layer 123 in contact with the first organic light emitting layer 122 may emit red light. Alternatively, the first organic light emitting layer 122 may emit yellow-green light and red light, and the second organic light emitting layer 123 may emit red light. By doing so, the first light-emitting stack 120 may emit yellow-green light and red light.

In the case that the first organic light emitting layer 122 emits yellow-green light, the first dopant material D1 may be yellow-green dopant material. That is, the first dopant material D1 emits the light in the range of yellow-green wavelength only, and the first organic light emitting layer 122 may emit yellow-green light only. Alternatively, the first dopant material D1 emits the light in a relatively wide wavelength range, and the first organic light emitting layer 122 may emit red light as well as yellow-green light. In the case that the first organic light emitting layer 122 emits red light as well as yellow-green light, the first dopant material D1 may emit yellow-green light more strongly than red light.

For example, the EL spectrum of the light emitted from the first organic light emitting layer 122 doped with the first dopant material D1 (1) may have a peak only in the range of yellow-green wavelength, (2) may have a first peak in the range of yellow-green wavelength and a second peak lower than the first peak in the range of red wavelength, or (3) may have a first peak in the range of yellow-green and an inflection point between the yellow-green wavelength range and the red wavelength range.

For example, the first dopant material D1 may be made of, but is not limited to, a material including at least one selected from the group consisting of iridium (Ir) ligand complexes including Ir(ppy)3(fac tris(2-phenylpyridine) iridium) and Alq3(tris(8-hydroxyquinolino)aluminum).

The weight ratio of the first dopant material D1 in the first organic light emitting layer 122 may range from 10% to 20%. The thickness of the first organic light emitting layer 122 is a key factor associated with exciton formation and emission location. The thickness of the first organic light emitting layer 122 may be adjusted by controlling the doping range, i.e., thickness of the first dopant material D1. The first dopant material D1 may be doped such that it has a thickness between 100 Å and 500 Å.

In the case that the second organic light emitting layer 123 emits red light, the second dopant material D2 may be red dopant material. That is, the second dopant material D2 emits the light in the range of red wavelength, and the second organic light emitting layer 123 may emit red light only.

For example, the EL spectrum of the light emitted from the second emitting layer 123 doped with the second dopant material D2 may have a peak only in the range of red wavelength.

For example, the second dopant material D2 may be made of, but is not limited to, a material including at least one of iridium (Ir) ligand complexes including Ir(ppy)3(fac tris(2-phenylpyridine)iridium), PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium) Ir(piq)3(tris(1-phenylisoquinoline)iridium) and Ir(piq)2(acac)(bis(1-phenylisoquinoline) (acetylacetonate)iridium), PtOEP (octaethylporphyrinporphine platinum) PBD:Eu(DBM)3 (Phen) and perylene.

The weight ratio of the second dopant material D2 in the second organic light emitting layer 123 may range from 2% to 4%. The thickness of the second organic light emitting layer 123 is a key factor associated with exciton formation and emission location. The thickness of the second organic light emitting layer 123 may be adjusted by controlling the doping range, i.e., thickness of the second dopant material D2. The second dopant material D2 may be doped such that it has a thickness between 50 Å and 150 Å. Accordingly, the doping range of the second dopant material D2 may be smaller than the doping range of the first dopant material D1.

Both of the first organic light emitting layer 122 and the second organic light emitting layer 123 are included in the first light-emitting stack 120. In other words, both of the first organic light emitting layer 122 and the second organic light emitting layer 123 receive holes and electrons by the first hole transport layer 121 and the first electron transport layer 124. Accordingly, the excitons generated in the first light-emitting stack 120 are shared by the first organic light emitting layer 122 and the second organic light emitting layer 123 from emitting light.

If the light emitted from the first organic light emitting layer 122 is in a relatively wide range including red wavelength as well as yellow-green wavelength, the red light emitted from the second organic light emitting layer 123 may only have to increase the color gamut of the red light. That is, the red light emitted from the second organic light emitting layer 123 may only have to expand/move the red chromaticity coordinates of the light emitted from the organic light-emitting device 100 toward the outer periphery of the chromaticity diagram. Accordingly, the intensity of the red light emitted from the second organic light emitting layer 123 need not be high. If the intensity of the red light emitted from the second organic light emitting layer 123 is too high, the intensity of the yellow-green light becomes too weak, which is undesirable. As the intensity of the light emitted from the second organic light emitting layer 123 becomes higher, the intensity of the light emitted from the first organic light emitting layer 122 becomes relatively low, because the excitons generated in the first light-emitting stack 120 are shared by the first organic light emitting layer 122 and the second organic light emitting layer 123. The relatively low intensity of the light emitted from the first organic light emitting layer 122 means that the intensity of the yellow-green light of the light emitted from the first organic light emitting layer 122 also becomes low as well as the intensity of the red light. Even though the intensity of the red light of the light emitted from the first organic light emitting layer 122 becomes low, it may be compensated for by the red light emitted from the second organic light emitting layer 123. However, as the second organic light emitting layer 123 does not emit yellow-green light, the intensity of the yellow-green light of the light emitted from the first organic light emitting layer 122 is not compensated for if it becomes low.

Accordingly, the intensity of the red light emitted from the second organic light emitting layer 123 may be reduced based on a trade-off between the first organic light emitting layer 122 and the second organic light emitting layer 123. For example, the intensity of the red light emitted from the second organic light emitting layer 123 needs to be reduced to the extent that it compensate for the color gamut of the red light.

To this end, the thickness of the first organic light emitting layer 122 may be larger than that of the second organic light emitting layer 123. Alternatively, the thickness at which the first dopant material D1 is distributed, i.e., the doping range of the first dopant material D1 may be larger than the thickness at which the second dopant material D2 is distributed, i.e., the doping range of the second dopant material D2. Alternatively, the content of the first dopant material D1 in the first light-emitting stack 120 may be larger than the content of the second dopant material D2 in the first light-emitting stack 120.

By doing so, the organic light-emitting device 100 according to the exemplary embodiment of the present disclosure may include the first light-emitting stack 120 from which the yellow-green light is emitted more strongly than the red light. Alternatively, the organic light-emitting device 100 according to the exemplary embodiment of the present disclosure may include the first light-emitting stack 120 in which the intensity of the light emitted from the first organic light emitting layer 122 is higher than the intensity of the light emitted from the second organic light emitting layer 123.

In order to optimize the thicknesses and contents of the first dopant material D1 and the second dopant material D2, the weight ratio of the first dopant material D1 in the first organic light emitting layer 122 and the weight ratio of the second dopant material D2 in the organic light emitting layer 123 may be adjusted. For example, (1) the weight ratio of the first dopant material D1 in the first organic light emitting layer 122 may be larger than the weight ratio of the second dopant material D2 in the second organic light emitting layer 123. Alternatively, (2) when the weight ratio of the first dopant material D1 in the first organic light emitting layer 122 ranges from 10% to 20%, the weight ratio of the second dopant material D2 in the second organic light emitting layer 123 may range from 2% to 4%.

If the weight ratio of the first dopant material D1 is less than 10%, the luminous efficiency of the first organic light emitting layer 122 becomes low rapidly over time even if the initial luminous efficiency was good, such that the lifespan of the organic light-emitting device 100 is shortened. On the other hand, if the weight ratio of the first dopant material D1 is higher than 20%, the initial luminous efficiency of the first organic light emitting layer 122 is low. Therefore, the weight ratio of the first dopant material D1 may be between 10% and 20%.

In addition, if the weight ratio of the second dopant material D2 is less than 2%, the intensity of the light emitted from the second organic light emitting layer 123 is too low, such that the color gamut of the red light of the organic light-emitting device 100 cannot be sufficiently compensated for. On the other hand, if the weight ratio of the second dopant material D2 is greater than 4%, the intensity of the light emitted from the second organic light emitting layer 123 is too high, such that the white chromaticity coordinates of the organic light-emitting device 100 are deviated. In addition, the luminous efficiency of the first organic emitting layer 122 becomes relatively low over time even if the initial luminous efficiency was good, such that the lifespan of the organic light-emitting device 100 is shortened. Therefore, the weight ratio of the second dopant material D2 may be between 2% and 4%.

In order to optimize the distribution thicknesses and contents of the first dopant material D1 and the second dopant material D2, for example, (1) the distribution thickness of the first dopant material D1 may be larger than the distribution thickness of the second dopant material D2. Alternatively, (2) the first dopant material D1 is doped into the first organic light emitting layer 122 such that it has a thickness between 100 Å and 500 Å, and the second dopant material D2 is doped into the second organic light emitting layer 123 such that it has a thickness between 50 Å and 150 Å.

If the distribution thickness of the first dopant material D1 is less than 100 Å, the luminous efficiency of the first organic light emitting layer 122 becomes low rapidly over time even if the initial luminous efficiency was good, such that the lifespan of the organic light-emitting device 100 is shortened. On the other hand, if the distribution thickness of the first dopant material D1 is higher than 500 Å, the overall thickness of the organic light-emitting device 100 becomes too large, such that the driving voltage increases. Therefore, the distribution thickness of the first dopant material D1 may be between 100 Å and 500 Å.

In addition, if the distribution thickness of the second dopant material D2 is less than 50 Å, the intensity of the light emitted from the second organic light emitting layer 123 is too low, such that the color gamut of the red light of the organic light-emitting device 100 cannot be sufficiently compensated for. On the other hand, if the distribution thickness of the second dopant material D2 is higher than 150 Å, the intensity of the light emitted from the second organic light emitting layer 123 is too high, such that the white chromaticity coordinates of the organic light-emitting device 100 are deviated. In addition, the luminous efficiency of the first organic emitting line 122 becomes relatively low over time even if the initial luminous efficiency was good, such that the lifespan of the organic light-emitting device 100 is shortened. Therefore, the distribution thickness of the second dopant material D2 may be between 50 Å and 150 Å.

Incidentally, in the organic light-emitting device 100 according to an exemplary embodiment of the present disclosure, if the first organic light emitting layer 122 generates yellow-green light and the second organic light emitting layer 123 generates red light, the intensity of the light generated in the first organic light emitting layer 122 may be lower than the intensity of the light generated in the second organic light emitting layer 123. The first organic light emitting layer 122 generating light of a relatively high intensity, i.e., stronger light may be formed in an area where the first material M1 overlaps with the second material M2. The second organic light emitting layer 123 generating light of a relatively low intensity, i.e., weaker light may be formed in an area other than the area where the first material M1 overlaps with the second material M2. The area other than the area where the first material M1 overlaps with the second material M2 may be divided into (1) an area close to the first electrode 110 (where the second material M2 is not distributed), and (2) an area close to the second electrode 150 (where the first material M1 is not distributed) from the area where the first material M1 overlaps with the second material M2. However, the movement of the holes by the first hole transport layer 121 is faster than the movement of the electrons by the first electron transport layer 124. Namely, the absolute value of hole mobility of the material of the first hole transport layer 121, i.e., the first material M1 is typically larger than the absolute value of the electron mobility of the material of the first electron transport layer 124, i.e., the second material M2. Since the first material M1 moves the holes well, the holes can sufficiently reach the area (2) close to the second electrode 150. If the second organic light emitting layer 123 emitting light of a relatively weak intensity is disposed in the area (2) close to the second electrode 150, the excitons in the second organic light emitting layer 123 may participate in emission before the electrons are delivered to the first organic light emitting layer 122. In order to increase the probability that the excitons in the first organic light emitting layer 122 participate in the emission, the second organic light emitting layer 122 emitting light of a relatively weak intensity may be disposed in the area (1) close to the first electrode 110. That is, the second organic light emitting layer 123 generating the light of an intensity lower than the intensity of the light generated in the first organic light emitting layer 122 is disposed in the area close to the first electrode from that area where the first material overlaps with the second material. The area close to the first electrode may include the first material but not the second material. Accordingly, the second organic light emitting layer 123 may be disposed closer to the first hole transport layer 121 than the first organic light emitting layer 122 is. In addition, the first organic light emitting layer 122 may be disposed closer to the first electron transport layer 124 than the second organic light emitting layer 123 is.

In addition, the HOMO energy level of the first electron transport layer 124 may be lower than the HOMO energy level of the second organic light emitting layer 123 such that the holes transferred to the second organic light emitting layer 123 fail to recombine with electrons to move from the second organic light emitting layer 123 beyond the first electron transport layer 124. In this regard, a hole blocking layer (HBL) may be further disposed on the second organic light emitting layer 123 in order to suppress excitons from being generated in the other areas than the first organic light emitting layer 122 and the second organic light emitting layer 123. The first electron transport layer 124 may work as the hole blocking layer.

By the hole blocking layer, it is possible to suppress the holes that fail to participate in recombination in the first organic light emitting layer 122 and the second organic light emitting layer 123 from leaking. In particular, this is more effective when the first organic light emitting layer 122 and the second organic light emitting layer 123 use a phosphorescent material to emit light because the exciton lifetime of the phosphorescent material is longer than that of a fluorescent material.

As described above, the distribution thicknesses and the contents of the first dopant material D1 and the second dopant material D2 may be optimized so as not to decrease the intensity of the yellow-green light generated in the first organic light emitting layer 122. By optimizing the thicknesses and contents of the first dopant material D1 and the second dopant material D2, the color gamut of the red light emitted from the first light-emitting stack 120 is compensated for by the red light generated in the second organic light emitting layer 123, without increasing the driving voltage and reducing the lifespan of the organic light-emitting device 100.

That is, by disposing the second organic light emitting layer 123 and the first organic light emitting layer 122 that emit lights of different colors each other, the organic light-emitting device 100 with good color gamut and luminous efficiency can be provided. In addition, since the material of the first electron transport layer 124 or the material of the first hole transport layer 121 are used as the host materials of the first organic light emitting layer 122 and the second organic light emitting layer 123, the organic light-emitting device 100 having a simpler structure can be provided without using any additional material. In addition, since the first light-emitting stack 120 has a simple structure, fabricating process becomes simpler, and thus the production yield of the organic light-emitting device 100 can be improved. In addition, the second organic light emitting layer 123 and the first hole transport layer 121, the first organic light emitting layer 122 and the first electron transport layer 124, or the first organic light emitting layer 122 and the first hole transport layer 121 share the same material, such that the organic light-emitting device 100 with good interfacial properties for charge movement can be provided.

Referring to back to FIG. 1, the organic light-emitting device 100 according to the exemplary embodiment of the present disclosure will be further described.

The charge generation layer 130 is disposed between the first light-emitting stack 120 and the second light-emitting stack 140 to supply electric charges to the first light-emitting stack 120 and the second light-emitting stack 140. In other words, the charge generation layer 130 adjusts the balance of charges between the first light-emitting stack 120 and the second light-emitting stack 140. The charge generation layer 130 may be made up of a plurality of layers including an n-type charge generation layer (N-CGL) 131 and a p-type charge generation layer (P-CGL) 132, or may be made up of a single layer.

The n-type charge generation layer 131 injects electrons into the first light-emitting stack 120. The n-type charge generation layer 131 may include an n-type dopant material and an n-type host material. The n-type dopant material may be metals in Groups I and II in the Periodic Table, or organic materials to which metals or electrons can be injected or a mixture thereof. For example, the n-type dopant material may be alkali metal or alkali earth metal. That is, the n-type charge generation layer 131 may be, but is not limited to, an organic layer doped with an alkali metal such as lithium (Li), sodium (Na), potassium (K) and cesium (Cs), or an alkali earth metal such as magnesium (Mg), strontium (Sr), barium (Ba) and radium (Ra). For example, the n-type host material may be made of a material capable of delivering electrons including, but is not limited to, at least one of Alq3 (tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ(3-(4-biphenyl) 4-phenyl-5-tert-butylphenyl-1,2,4-triazole), spiro-PBD, and BAlq(bis(2-methyl-8-quinolinolate)-4-(phenylphenolato)aluminium), SAlq, TPBi(2.2',2-(1,3,5-benzinetriyl)-tris(1-phenyl-1-H-benzimidazole), oxadiazole, triazole, phenanthroline, benzoxazole or benzthiazole.

The p-type charge generation layer 132 injects holes into the second light-emitting stack 140. The p-type charge generation layer 132 may include a p-type dopant material and a p-type host material. The p-type charge generation layer 132 is disposed on the n-type charge generation layer 131, such that they have junction structure. The p-type dopant material may be made of, but is not limited to, a metal oxide, an organic material such as tetra(fluoro)-tetra (cyano) quinodimethane (F4-TCNQ), HAT-CN (Hexaazatri-phenylene-hexacarbonitrile), hexaazatriphenylene, or a metal material such as V2O5, MoOx, WO3, etc. The p-type host material may be made of a material capable of delivering holes including, but is not limited to, at least one of NPD(N,N-dinaphthyl-N,N'-diphenyl benzidene) (N,N'-bis (naphthalene-1-yl)-N,N'-bis(phenyl)-2,2'-di methylbenzi-dine), TPD(N,N'-bis-(3-methylphenyl)-N,N'-bis-(phenyl)-benzidine) and MTDATA (4,4',4-Tris(N-3-methylphenyl-N-phenyl-amino)-triphenylamine).

The second light-emitting stack 140 emits light of a color different from that of the first light-emitting stack 120 and is disposed on the charge generation layer 130. The second light-emitting stack 140 includes a second hole transport layer disposed on the charge generation layer 130, a third organic light emitting layer disposed on the second hole transport layer, and a second electron transport layer disposed on the third organic light emitting layer.

The third organic light emitting layer may have a host-dopant system, in which a host material having a large weight ratio is doped with a luminous dopant material at a weight ratio of 2% to 20%, i.e., a small amount of the luminous dopant material.

The second hole transport layer receive holes from the p-type charge generation layer 132 to deliver the holes to the third organic light emitting layer. The second hole transport layer may be made of the same material as the first hole transport layer 121. The second hole transport layer is substantially identical to the first hole transport layer 121; and, therefore, the redundant description will not be made.

The second electron transport layer receives electrons from second electrode 150 to deliver the electrons to the third organic light emitting layer. The second electron transport layer may be made of the same material as the first electron transport layer 124. The second electron transport layer is substantially identical to the first electron transport layer 124; and, therefore, the redundant description will not be made.

The third organic light emitting layer is disposed between the second hole transport layer and the second electron transport layer. The third organic light emitting layer is disposed at a position in the second light-emitting stack 120 where a lot of excitons are formed, and includes a material emitting light of a particular color. The third organic light emitting layer includes, but is not limited to, a luminous material that emits red light, green light, blue light or yellow-green light. For example, if the organic light-emitting device 100 is configured to produce white light, the first organic light emitting layer 122 may emit yellow-green light, the second organic light emitting layer 123 may emit red light, and the third organic light emitting layer may emit blue light.

In other words, the EL spectrum of the light emitted from the first light-emitting stack 120 may have a first peak in the range of yellow-green wavelength or may have a second peak in the range of red wavelength. The EL spectrum of the light emitted from the second light-emitting stack 140 may have a third peak in the range of blue wavelength.

The third organic light emitting layer may include a plurality of host materials or may include a single host material. The third organic light emitting layer including the plurality of host materials or the single host material is doped with a small amount of a third dopant material.

In the case that the third organic light emitting layer emits blue light, the third dopant material doped into the third organic light emitting layer may be blue dopant material. The third dopant material is capable of emitting blue light. The EL spectrum of the light emitted from the third organic light emitting layer doped with the third dopant material (1) may have a peak in the range of blue wavelength, (2) may have a peak in the range of deep blue wavelength or (3) may have a peak in the range of sky blue wavelength.

For example, the host material of the third organic light emitting layer may be made of, but is not limited to, at least one of Alq3(tris(8-hydroxy-quinolino)aluminum), ADN(9,10-di(naphtha-2-yl)anthracene), BSBF(2-(9,9-spirofluoren-2-yl)-9,9-spirofluorene), CBP (4,4'-bis(carbazol-9-yl)biphenyl), spiro-CBP(2,2',7,7'-tetrakis(carbazol-9-yl)-9,9'-spirobifluorene), mCP and TcTa (4,4',4-tris(carbazoyl-9-yl) triphenylamine).

In addition, the third dopant material of the third organic light emitting layer may be made of a material including, but is not limited to, at least one of arylamine-substituted pyrenes, iridium (Ir) ligand complexes including (4,6-F2ppy) 2Irpic, FIrPic (bis(3,5-difluoro-2-(2-pyridyl)phenyl-(2-carboxypyridyl) iridium), and Ir(ppy)3(fac tris(2-phenylpyridine) iridium), spiro-DPVBi, spiro-6P, spiro-BDAVBi (2,7-bis[4-(diphenylamino) styryl]-9,9'-spirofluorene), distyrylbenzene (DSB), distyrylarylene (DSA), PFO-based polymer and PPV-based polymer.

Hereinafter, a modification of the first light-emitting stack 120 shown in FIG. 2 will be described with reference to FIGS. 3 and 4.

The structure shown in FIG. 3 further includes a first electron injection layer (EIL) and a first hole injection layer (HIL) in addition to the elements of the first light-emitting stack 120. Referring to FIG. 3, a first light-emitting stack 220 includes a first hole injection layer 225 disposed on a first electrode 110, a first hole transport layer 221 disposed on the first hole injection layer 225, a second organic light emitting layer 223 disposed on the first hole transport layer 221, a first organic light emitting layer 222 disposed on the second organic light emitting layer 223, a first electron transport layer 224 disposed on the first organic light emitting layer 222, and a first electron injection layer 226 disposed on the first electron transport layer 224.

The first hole transport layer 221, the first organic light emitting layer 222, the second organic light emitting layer 223 and the first electron transport layer 224 shown in FIG. 3 are substantially identical to the first hole transport layer 121, the first organic light emitting layer 122, the second organic light emitting layer 123 and the first electron transport layer 124, respectively. Therefore, the redundant description will not made, and only the additional elements of the first light-emitting stack 220 shown in FIG. 3, i.e., the first electron injection layer 226 and the first hole injection layer 225 will be described.

The first hole injection layer 225 is an organic layer that facilitates hole injection into the first organic light emitting layer 222 and the second organic light emitting layer 223 from the first electrode 110. The first hole injection layer 225 may be made of, but is not limited to, a material including at least one of HATCN(2, 4, 5, 8, 9, 11-hexaazatriphenylene-hexanitrile) (dipyrazino[2,3-f:2',3'-h]quinoxaline-2,3,6,7,10.11-hexacarbonitrile] and CuPc(cupper phthalocyanine), PEDOT(poly(3,4)-ethylenedioxythiophene), PANI(polyaniline) and NPD(N,N-dinaphthyl-N,N'-diphenylbenzidine) (N,N'-bis(naphthalene-1-yl)-N,N'-bis(phenyl)-2,2'-dimethylbenzidine), MTDATA(4,4',4-tris(3-methylphenylphenylamino)triphenylamine), CuPc(copper phthalocyanine) or PEDOT/PSS(poly(3,4-ethylenedioxythiphene, polystyrene sulfonate).

The first electron injection layer 226 is an organic layer that facilitates electron injection into the first organic light emitting layer 222 and the second organic light emitting layer 223 from the second electrode 150. The first electron injection layer 226 may be made of, but is not limited to, a material including at least one of LiF, $CsCO_3$, Liq, CsF and Ca.

By disposing the second organic light emitting layer 223 and the first organic light emitting layer 222 that emit lights of different colors in the first light-emitting stack 220, an organic light-emitting device with good color gamut and high luminous efficiency can be provided. In addition, since the material of the first electron transport layer 224 or the material of the first hole transport layer 221 are used as the host materials of the first organic light emitting layer 222 and the second organic light emitting layer 223, the organic light-emitting device having a simpler structure can be provided without using any additional material. Since the first light-emitting stack 220 has a simple structure, fabricating process becomes simpler, and thus the production yield of the organic light-emitting device can be improved. In addition, the second organic light emitting layer 223 and the first hole transport layer 221, the first organic light emitting layer 222 and the first electron transport layer 224, or the first organic light emitting layer 222 and the first hole transport layer 221 share the same material, such that an organic light-emitting device with good interfacial properties for charge movement can be provided. In addition, the first light-emitting stack 220 includes the first hole injection layer 225 and the first electron injection layer 226, such that the hole and electron injection into the first organic light emitting layer 222 and the second organic light emitting layer 223 can be further facilitated, and the organic light-emitting device with lower driving voltage can be provided.

FIG. 4 shows a structure further including an auxiliary electron transport layer in addition to the elements of the first light-emitting stack 220 shown in FIG. 3. Referring to FIG. 4, a first light-emitting stack 320 includes a first hole injection layer 325 disposed on a first electrode 110, a first hole transport layer 321 disposed on the first hole injection layer 325, a second organic light emitting layer 323 disposed on the first hole transport layer 321, a first organic light emitting layer 322 disposed on the second organic light emitting layer 323, a first electron transport layer 324 disposed on the first organic light emitting layer 322, an auxiliary electron injection layer 327 disposed on the first electron transport layer 324, and a first electron injection layer 326 disposed on the auxiliary electron transport layer 327.

The first hole transport layer 321, the first organic light emitting layer 322, the second organic light emitting layer 323 and the first electron transport layer 324 shown in FIG. 4 are substantially identical to the first hole transport layer 121, the first organic light emitting layer 122, the second organic light emitting layer 123 and the first electron transport layer 124, respectively. In addition, the first hole injection layer 325 and the first electron injection layer 326 shown in FIG. 4 are identical to the first hole injection layer 225 and the first electron injection layer 226 shown in FIG. 3, respectively. Therefore, the redundant description will not made, and only the additional element of the first light-emitting stack 320 shown in FIG. 4, i.e., the auxiliary electron transport layer 327 will be described.

As mentioned above, the HOMO energy level of the first electron transport layer 324 may be lower than the HOMO energy level of the second organic light emitting layer 323 such that the holes delivered to the second organic light emitting layer 323 may fail to recombine with electrons such that they may move from the second organic light emitting layer 323 beyond the first electron transport layer 324. In this regard, in order to suppress the holes from moving from the second organic light emitting layer 323 beyond the first electron transport layer 324, the HOMO energy level of the first electron transport layer 324 may be lower than the HOMO energy level of the second organic light emitting layer 323. That is, in order to suppress excitons from being formed in other area than the first organic light emitting layer 322 and the second organic light emitting layer 323, a hole blocking layer (HBL) may be further disposed on the second organic light emitting layer 323. The first electron transport layer 324 may work as the hole blocking layer. When the first electron transport layer 324 also works as the hole blocking layer, the auxiliary electron transport layer 327 may be further disposed on the first electron transport layer 324. The auxiliary electron transport layer 327 may not include a material of the first electron transport layer 324. For example, the auxiliary electron transport layer 327 may not include the second material M2.

The auxiliary electron transport layer 327 is an organic layer that facilitates electron transport from the second electrode 150 to the first organic light emitting layer 322 and the second organic light emitting layer 323. For example, the auxiliary electron transport layer 327 may be made of, but is not limited to, one of Alq3 (tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi (2.2',2-(1,3,5-benzinetriyl)-tris(1-phenyl-1-H-benzimidazole), oxadiazole, triazole, phenanthroline, benzoxazole or benzthiazole.

By disposing the first organic light emitting layer 322 and the second organic light emitting layer 323 that emit lights of different colors in the first light-emitting stack 320, an organic light-emitting device with good color gamut and high luminous efficiency can be provided. In addition, since the material of the first electron transport layer 324 or the material of the first hole transport layer 321 are used as the host materials of the first organic light emitting layer 322 and the second organic light emitting layer 323, the organic light-emitting device having a simpler structure can be provided without using any additional material. Since the first light-emitting stack 320 has a simple structure, fabricating process becomes simpler, and thus the production yield of the organic light-emitting device can be improved. In addition, the second organic light emitting layer 323 and the first hole transport layer 321, the first organic light emitting layer 322 and the first electron transport layer 324, or the first organic light emitting layer 322 and the first hole transport layer 321 share the same material, such that an organic light-emitting device with good interfacial properties for charge movement can be provided. In addition, the first light-emitting stack 320 includes the first hole injection layer 325, the first electron injection layer 326 and the auxiliary electron transport layer 327, such that the hole and electron injection into the first organic light emitting layer 322 and the second organic light emitting layer 323 can be further facilitated, and the organic light-emitting device with lower driving voltage can be provided.

Hereinafter, the performance and effects of the organic light-emitting device according to exemplary embodiments of the present disclosure will be described with reference to FIGS. 5 to 10.

FIGS. 5 to 8 are graphs and tables showing overall optical properties of a 1-stack organic light-emitting device emitting yellow-green-red light from a first light-emitting stack.

Figure 5:
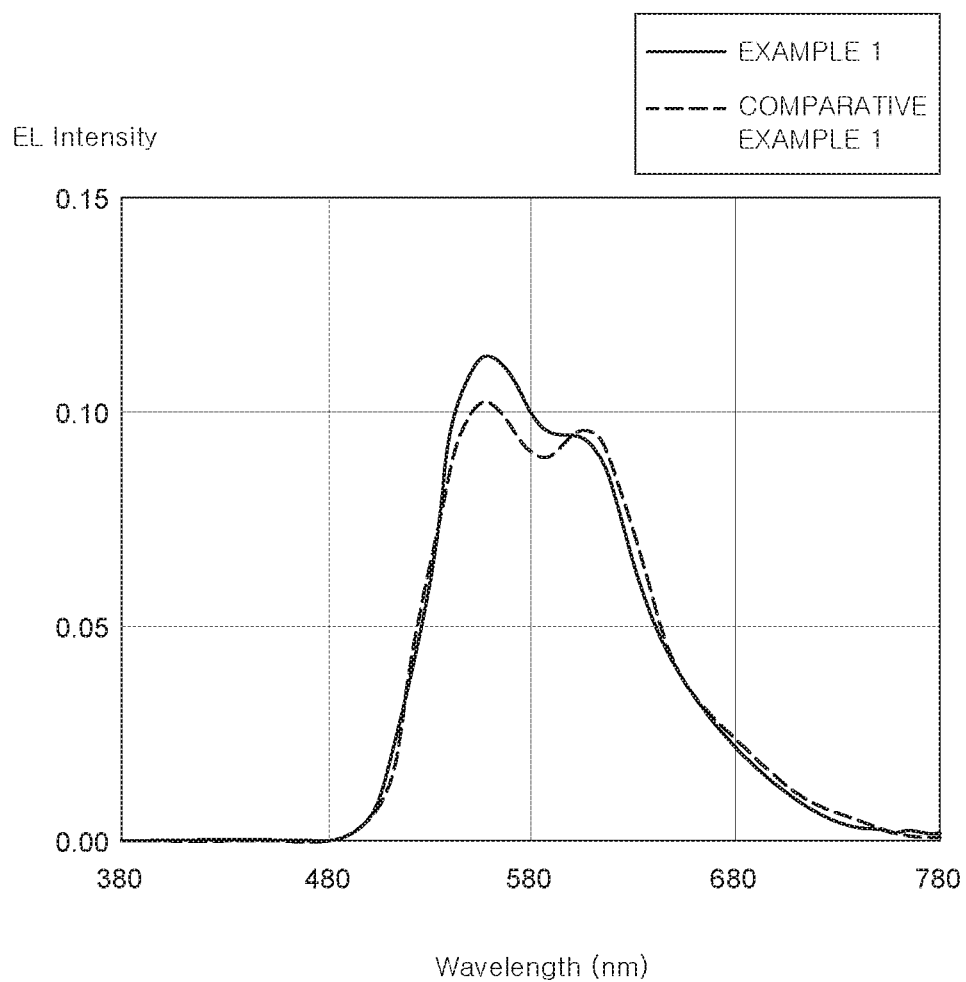
FIG. 5 is a graph showing the EL spectrum of Example 1 and the EL spectrum of Comparative Example 1.

FIG. 5 is a graph showing the EL spectrum according to Example 1 and the EL spectrum according to Comparative Example 1. In FIG. 5, x-axis refers to wavelength and y-axis refers to EL intensity versus wavelength. Example 1 and Comparative Example 1 employ a 1-stack organic light-emitting device that emits yellow-green-red light. Example 1 employs the organic light-emitting device including the first light-emitting stack 120 described above with respect to FIG. 2. In Example 1, the first hole transport layer, the first organic light emitting layer and the second organic light emitting layer share a material, whereas in Comparative Example 1, the organic light-emitting device emits yellow-green light and red light. In addition, in Example 1, the first electron transport layer and the first organic light emitting layer share a material, whereas in Comparative Example 1, the organic light-emitting device emits yellow-green light and red light. In other words, in Example 1, the host material of the first organic light emitting layer and the host material of the second organic light emitting layer are made of the material of the first hole transport layer, and the host material of the first organic light emitting layer is made of the material of the first electron transport layer. On the other hand, in Comparative Example 1, the host material of the first organic light emitting layer was included neither in the first hole transport layer nor the first electron transport layer, and the host material of the second organic light emitting layer was not included in the first hole transport layer.

The organic light-emitting device according to Example 1 was fabricated as follows: A first electrode 110 was formed on a glass substrate. Then, a first hole transport layer 121 was formed on the first electrode 110. Then, a second organic light emitting layer 123 was formed on the first hole transport layer 121. Then, a first organic light emitting layer 122 was formed on the second organic light emitting layer 123. Then, a first electron transport layer 124 was formed on the first organic light emitting layer 122, and a second electrode 150 was formed on the first electron transport layer 124. In the process of forming the first hole transport layer 121, the second organic light emitting layer 123 and the first organic light emitting layer 122 sequentially, a first material M1 was deposited continuously across the first hole transport layer 121, the second organic light emitting layer 123 and the first organic light emitting layer 122. In addition, a second material M2 was deposited continuously across the first organic light emitting layer 122 and the first electron transport layer 124. To form the first organic light emitting layer 122, a first dopant material D1 was doped when the first material M1 and the second material M2 were deposited together. In addition, to form the second organic light emitting layer 123, immediately before doping the first dopant material D1, a second dopant material D2 was doped when the first material M1 was deposited.

The organic light-emitting device according to Comparative Example 1 was fabricated as follows: A first electrode was formed on a glass substrate. Then, a first hole transport layer was formed on the first electrode. Then, a second organic light emitting layer was formed on the first hole transport layer. Then, a first organic light emitting layer was formed on the second organic light emitting layer. Then, a first electron transport layer was formed on the first organic light emitting layer, and a second electrode was formed on the first electron transport layer. The thickness of each of the layers of the organic light-emitting device according to Example 1 is equal to the thickness of the counterpart of the organic light-emitting device according to Comparative Example 1. The host material included in the first organic light emitting layer was produced with a different material from the material of the first electron transport layer or the first hole transport layer.

Referring to FIG. 5, in both of the EL spectrum according to Example 1 indicated by the solid line and the EL spectrum according to Comparative Example 1 indicated by the dashed line, peaks appear around 550 nm to 570 nm corresponding to yellow-green wavelength (referred hereinafter to as yellow-green peaks). The yellow-green peak of the EL spectrum according to Example 1 is higher than the yellow-green peak of the EL spectrum according to Comparative Example 1. In other words, the intensity of the yellow-green light emitted from the organic light-emitting device according to Example 1 is higher than the intensity of the yellow-green light emitted from the organic light-emitting device according to Comparative Example 1. In addition, in both of the EL spectrum according to Example 1 and the EL spectrum according to Comparative Example 1, peaks appear around 600 nm to 650 nm corresponding to red wavelength (referred hereinafter to as red peaks). The yellow-green peak of the EL spectrum according to Example 1 is higher than that of the EL spectrum according to Comparative Example 1, as much as the red peak of the EL spectrum according to Example 1 is lower than that of the EL spectrum according to Comparative Example 1. Namely, the integral value of the EL spectrum corresponding to the external quantum efficiency of the organic light-emitting device according to Example 1 is similar to that of the Comparative Example 1, whereas the intensity of yellow-green light according to Example 1 is different from that of Comparative Example 1. As shown in FIG. 6, the external quantum efficiency of Example 1 is similar to that of Comparative Example 1, whereas the luminous efficiency of Example 1 is higher than that of Comparative Example 1. This is because the EL spectrum of Example 1 overlaps with a viewer's luminosity curve (a curve exhibiting the highest luminosity around the wavelength of 560 nm with respect to light in the range of visible ray wavelength) more than the EL spectrum of Comparative Example 1 does.

Figure 7:
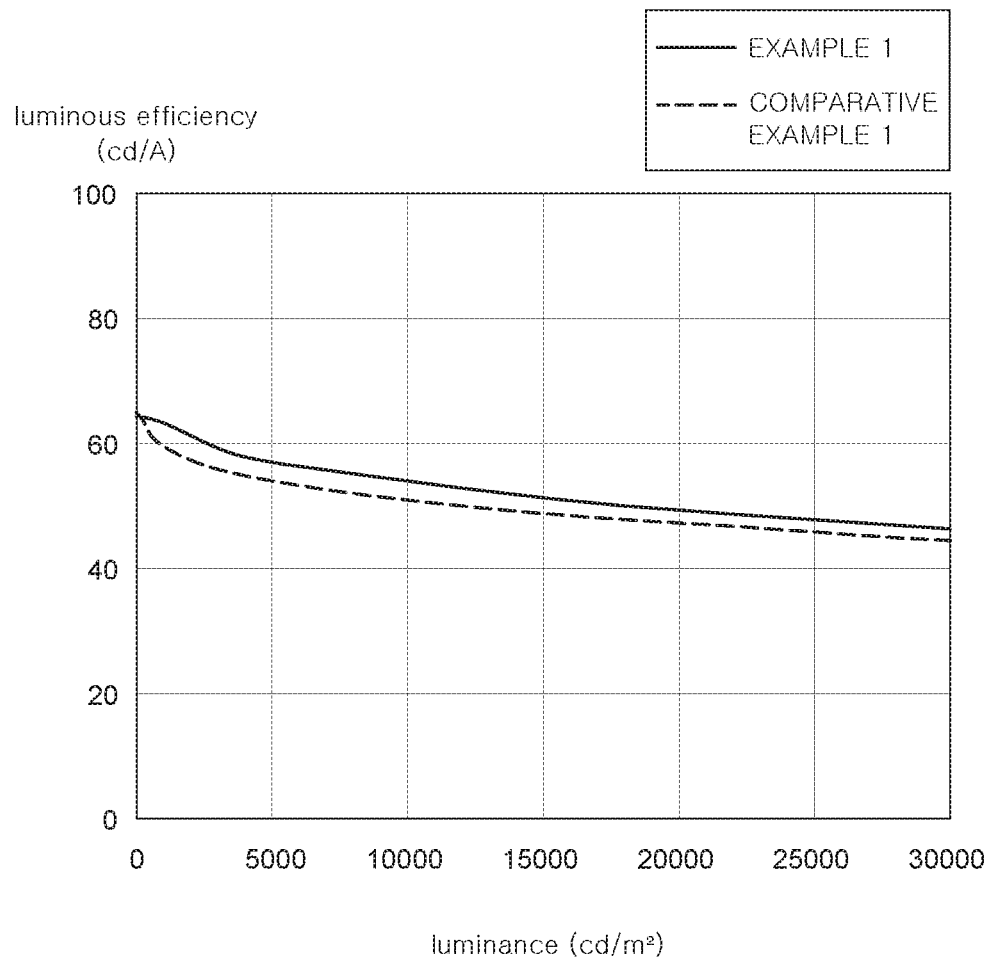
FIG. 7 is a graph showing luminous efficiency versus luminance of Example 1 and luminous efficiency versus luminance of Comparative Example 1.

FIG. 7 is a graph showing luminous efficiency versus luminance according to Example 1 and luminous efficiency versus luminance according to Comparative Example 1. In FIG. 7, x-axis refers to luminance and y-axis refers to luminous efficiency versus luminance. Referring to FIG. 7, the luminance-to-luminous efficiency curve according to Example 1 indicated by the solid line is consistently higher than the luminance-to-luminous efficiency curve according to Comparative Example 1 indicated by the dashed line. That is, the luminous efficiency of Example 1 is higher than the luminous efficiency of Comparative Example 1 throughout the entire luminance.

Figure 8:
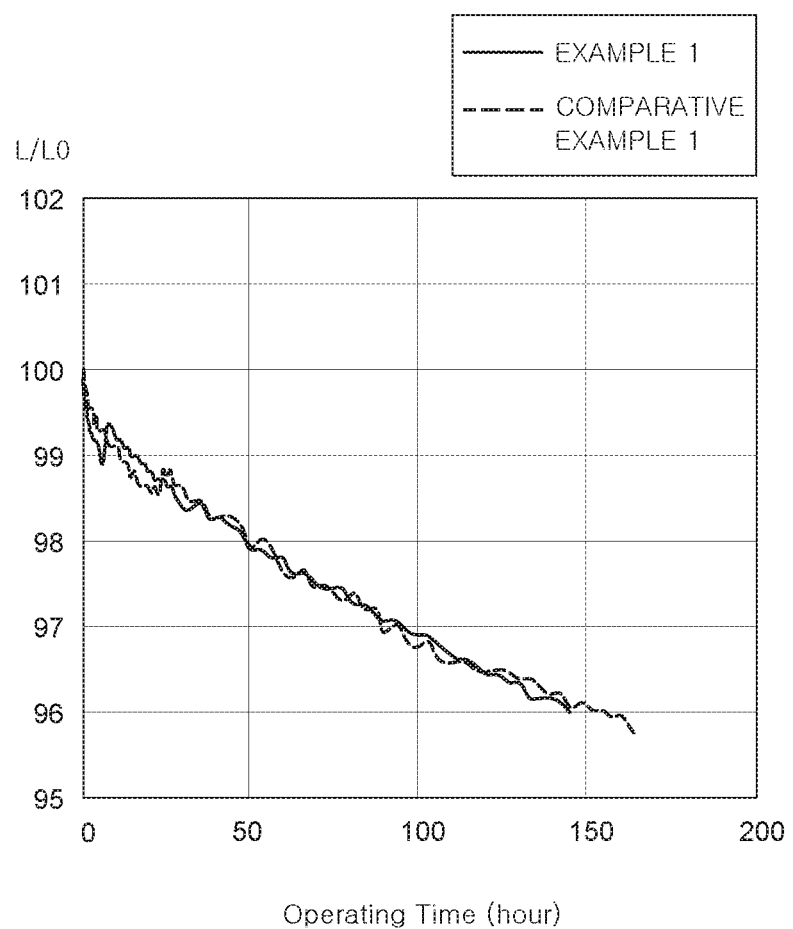
FIG. 8 is a graph showing luminance degradation over operating time in Example 1 and luminance degradation over operating time in Comparative Example 1.

FIG. 8 is a graph showing luminance degradation over operating time in Example 1 and luminance degradation over operating time in Comparative Example 1. In FIG. 8, x-axis refers to operating time at the room temperature, and y-axis refers to percentage of luminance degraded over operating time with respect to the initial luminance. Referring to FIG. 8, the operating time-to-luminance curve of Example 1 indicated by the solid line generally overlaps the operating time-to-luminance curve of Comparative Example 1 indicated by the dashed line. As described above, the driving voltage of Example 1 is similar to that of the Comparative Example 1 at the same luminance. In addition, the luminous efficiency of Example 1 is higher than that of Comparative Example 1 throughout the entire luminance. Therefore, Example 1 exhibits better overall optical properties over Comparative Example 1 while maintaining the lifespan equally.

In Example 1, (1) the host material of the first organic light emitting layer and the host material of the second organic light emitting layer are made of the material of the first hole transport layer, and (2) the host material of the first organic light emitting layer is made of the material of the first electron transport layer. By doing so, the number of materials of the first light-emitting stack 120 according to Example 1 is reduced compared with that number of materials of the first light-emitting stack according to Comparative Example 1. As a result, it is easier to produce the organic light-emitting device according to Example 1 than the organic light-emitting device according to Comparative Example 1. In addition, the overall optical properties of the first light-emitting stack 120 according to example 1 is better than that of the first light-emitting stack according to Comparative Example 1, even though the number of materials used in example 1 is less than that of Comparative Example 1.

The performance of the organic light-emitting device 100 will be described with reference to FIGS. 9 and 10, based on the performance of the first light-emitting stack 120 that is an element of the organic light-emitting device 100 obtained from FIGS. 5 to 8.

Figure 9:
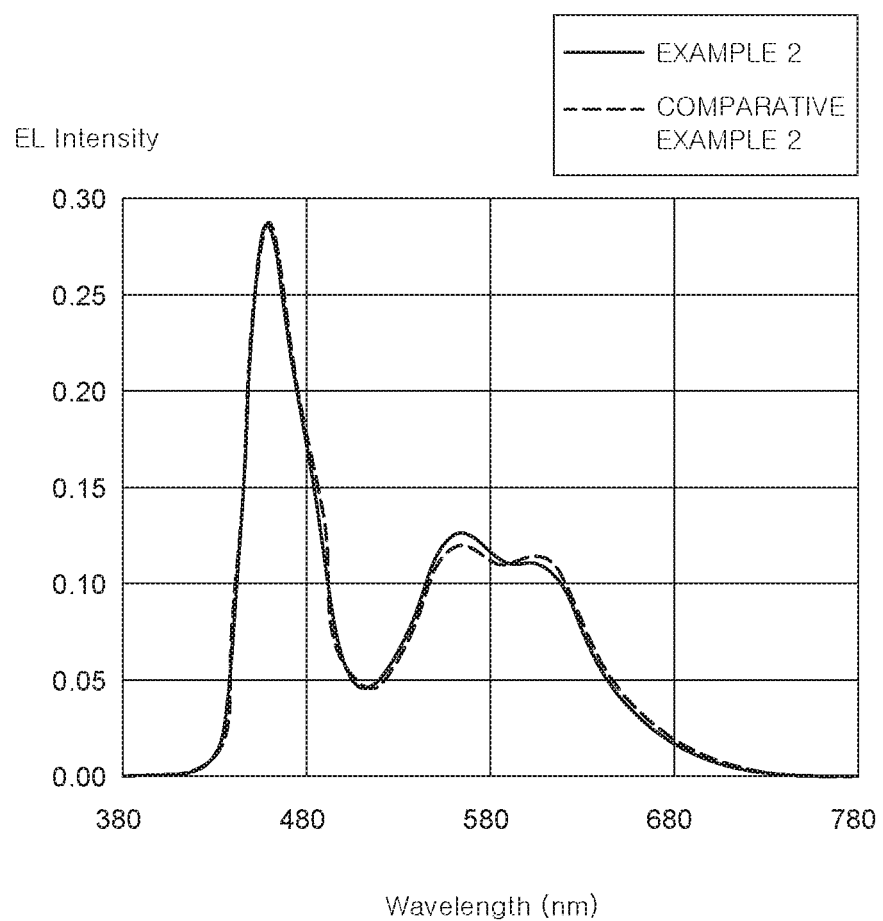
FIG. 9 is a graph showing the EL spectrum of Example 2 and the EL spectrum of Comparative Example 2.

FIGS. 9 to 10 are a graph and a table, respectively, showing overall optical properties of a 2-stack organic light-emitting device 100 in which a first light-emitting stack emits yellow-green-red light and a second light-emitting stack emits blue light, thereby producing white light.

FIG. 9 is a graph showing the EL spectrum according to Example 2 and the EL spectrum according to Comparative Example 2. In FIG. 9, x-axis refers to wavelength and y-axis refers to EL intensity versus wavelength. Each of the organic light-emitting devices according to Example 2 and Comparative Example 2 includes the first light-emitting stack emitting yellow-green-red light and a second light-emitting stack emitting blue light to thereby produce white light.

The organic light-emitting device according to Example 2 further includes the charge generation layer 130 and the second light-emitting stack 140 of the organic light-emitting device 100 shown in FIG. 1 in addition to the element of Example 1. The organic light-emitting device according to Comparative Example 2 further includes the charge generation layer and the second light-emitting stack identical to the charge generation layer 130 and the second light-emitting stack 140 included in Example 2.

Unlike Example 2, however, the organic light-emitting device according to Comparative Example 2 does not include any material shared by the first hole transport layer and the first organic light emitting layer. In addition, unlike Example 2, the organic light-emitting device according to Comparative Example 2 does not include any material shared by the first hole transport layer and the second organic light emitting layer. In addition, unlike Example 2, the organic light-emitting device according to Comparative Example 2 does not include any material shared by the first organic light emitting layer and the first electron transport layer.

In other words, according to Example 2, the first hole transport layer was made of the host material shared by the first organic light emitting layer and the second organic light emitting layer, and the first electron transport layer was made of the host material included only in the first organic light emitting layer. In contrast, according to Comparative Example 2, the first organic light emitting layer and the first hole transport layer share no material, the second organic light emitting layer and the first hole transport layer share no material, and the first organic light emitting layer and the first electron transport layer share no material.

The organic light-emitting device according to Example 2 further includes the charge generation layer 130 and the second light-emitting stack 140 in addition to the elements of Example 1. The organic light-emitting device according to Comparative Example 2 further includes the charge generation layer and the second light-emitting stack in addition to the elements of Comparative Example 1. The thickness of each of the layers of the organic light-emitting device according to Example 2 is equal to the thickness of the counterpart of the organic light-emitting device according to Comparative Example 2.

Referring to FIG. 9, in both of the EL spectrum of Example 2 indicated by the solid line and the EL spectrum of Comparative Example 2 indicated by the dashed line, peaks appear around 460 nm corresponding to blue wavelength (referred hereinafter to as blue peaks). The blue peak of the EL spectrum of Example 2 is almost identical to the blue peak of the EL spectrum of Comparative Example 2. In view of this, it can be seen that there is no difference in the overall optical properties between the second light-emitting stack 140 according to Example 2 and the second light-emitting stack according to Comparative Example 2 even if the first light-emitting stack 120 according to Example 2 is different from the first light-emitting stack according to Comparative Example 2.

In addition, both of the EL spectrum of the Example 2 and the EL spectrum of Comparative Example 2 have yellow-green peaks. In addition, the yellow-green peak of the EL spectrum of Example 2 is higher than the yellow-green peak of the EL spectrum of Comparative Example 2. In other words, the intensity of the yellow-green light emitted from the organic light-emitting device according to Example 2 is higher than the intensity of the yellow-green light emitted from the organic light-emitting device according to Comparative Example 2. In addition, both of the EL spectrum of the Example 2 and the EL spectrum of Comparative Example 2 have red peaks. The yellow-green peak of the EL spectrum of Example 2 is higher than that of the EL spectrum of Comparative Example 2, while the red peak of the EL spectrum of Example 2 is lower than that of the EL spectrum of Comparative Example 2. Namely, the integral value of the EL spectrum corresponding to the external quantum efficiency of the organic light-emitting device according to Example 2 is similar to that of Comparative Example 2, whereas the intensity of yellow-green light of Example 2 is different from that of Comparative Example 2. Namely, the integral value of the EL spectrum corresponding to the external quantum efficiency of the organic light-emitting device according to Example 2 is similar to that of Comparative Example 2, whereas luminous efficiency of Example 2 is higher than that of Comparative Example 2 as shown in FIG. 10. This is because the EL spectrum of Example 2 overlaps with a viewer's luminosity curve (a curve exhibiting the highest luminosity around the wavelength of 560 nm with respect to light in the range of visible ray wavelength) more than the EL spectrum of Comparative Example 2 does.

In Example 2, (1) the host material of the first organic light emitting layer and the host material of the second organic light emitting layer are made of the material of the first hole transport layer, and (2) the host material of the first organic light emitting layer is made of the material of the first electron transport layer. By doing so, the number of materials of the first light-emitting stack 120 according to Example 2 is reduced compared with that number of materials of the first light-emitting stack according to Comparative Example 2. As a result, it is easier to produce the organic light-emitting device according to Example 2 than the organic light-emitting device according to Comparative Example 2. In addition, the overall optical properties of the first light-emitting stack 120 according to Example 2 is better than that of the first light-emitting stack according to Comparative Example 2, even though the number of materials used in Example 2 is less than that of Comparative Example 2.

The exemplary embodiments of the present disclosure can also be described as follows.

According to an aspect of the present disclosure, there is provided an organic light-emitting device including: a first hole transport layer made of a first material of hole transport type; a first electron transport layer made of a second material of electron transport type; a first organic light emitting layer between the first electron transport layer and the first hole transport layer and comprising the first material and the second material as a plurality of host materials; and a second organic light emitting layer between the first organic light emitting layer and the first hole transport layer and comprising the first material as a single host material. A wavelength of light emitted from the second organic light emitting layer is longer than a wavelength of light emitted from the first organic light emitting layer.

The plurality of host materials of the first organic light emitting layer may include two host materials, and the two host materials may be the first material and the second material.

The first organic light emitting layer may be configured to emit yellow-green light.

The second organic light emitting layer may be configured to emit red light.

The amount of a first dopant material doped into the first organic light emitting layer may be larger than the amount of a second dopant material doped into the second organic light emitting layer, and the weight ratio of the first dopant material doped into the first organic light emitting layer may range from 10% to 20%.

The weight ratio of the second dopant material doped into the second organic light emitting layer may range from 2% to 4%.

The thickness of the second organic light emitting layer may range from 50 Å to 150 Å.

The thickness of the first organic light emitting layer may be larger than a thickness of the second organic light emitting layer and may range from 100 Å to 500 Å.

The organic light-emitting device may further include: an auxiliary electron transport layer on the first organic light emitting layer and the first electron transport layer and including no second material. The HOMO (highest occupied molecular orbitals) energy level of the first electron transport layer may be lower than the HOMO energy level of the second organic light emitting layer such that holes do not move from the second organic light emitting layer beyond the first electron transport layer.

The first hole transport layer, the second organic light emitting layer, the first organic light emitting layer and the first electron transport layer may form a first light-emitting stack. The organic light-emitting device may further include: a second light-emitting stack on the first light-emitting stack, and a second hole transport layer, a third organic light emitting layer configured to emit blue light and a second electron transport layer may form the second light-emitting stack; and a charge generation layer between the first light-emitting stack and the second light-emitting stack.

According to another aspect of the present disclosure, there is provided an organic light-emitting device including: a first hole transport layer and a first electron transport layer facing each other; and a first organic light emitting layer and a second organic light emitting layer between the first hole transport layer and the first electron transport layer. The first organic light emitting layer and the second organic light emitting layer share a same host material and are configured to emit light of different colors. The same host material is the same as a material of the first hole transport layer.

The absolute value of a hole mobility of a material of the first hole transport layer may be larger than the absolute value of an electron mobility of a material of the first electron transport layer.

The first organic light emitting layer may be closer to the first electron transport layer than the second organic light emitting layer, and the second organic light emitting layer may be closer to the first hole transport layer than the first organic light emitting layer.

The intensity of light emitted from the first organic light emitting layer may be larger than the intensity of light emitted from the second organic light emitting layer.

The first organic light emitting layer may be configured to emit yellow-green light, and the second organic light emitting layer may be configured to emit red light.

According to another aspect of the present disclosure, there is provided an organic light-emitting device including: a first hole transport layer made of a first material of hole transport type; a first electron transport layer made of a second material of electron transport type; a first organic light emitting layer at an area where the first material overlaps with the second material; and a second organic light emitting layer at an area other than the area where the first material overlaps with the second material. An intensity of light generated in the second organic light emitting layer may be lower than an intensity of light generated in the first organic light emitting layer.

The organic light-emitting device may further include: a first electrode and a second electrode facing each other. The first hole transport layer, the first electron transport layer, the first organic light emitting layer and the second organic light emitting layer may be between the first electrode and the second electrode. The area other than the area where the first material overlaps with the second material may be closer to the first electrode from the area where the first material overlaps with the second material.

The area closer to the first electrode from the area where the first material overlaps with the second material may include the first material but not the second material.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined solely by the appended claims and all equivalents thereof are construed to be within the true scope of the present disclosure.

What is claimed is:

1. An organic light-emitting device comprising:
   a first hole transport layer made of a first material of hole transport type;
   a first electron transport layer made of a second material of electron transport type;
   a first organic light emitting layer between the first electron transport layer and the first hole transport layer, and including the first material and the second material as a plurality of host materials; and
   a second organic light emitting layer between the first organic light emitting layer and the first hole transport layer, and including the first material as a single host material,
   wherein a wavelength of light emitted from the second organic light emitting layer is longer than a wavelength of light emitted from the first organic light emitting layer.

2. The organic light-emitting device of claim 1, wherein the plurality of host materials of the first organic light emitting layer includes two host materials, and the two host materials are the first material and the second material respectively.

3. The organic light-emitting device of claim 1, wherein the first organic light emitting layer is configured to emit yellow-green light.

4. The organic light-emitting device of claim 3, wherein the first hole transport layer, the second organic light emitting layer, the first organic light emitting layer and the first electron transport layer form a first light-emitting stack, and
  wherein the organic light-emitting device further comprises:
    a second light-emitting stack on the first light-emitting stack, wherein a second hole transport layer, a third organic light emitting layer configured to emit blue light and a second electron transport layer form the second light-emitting stack; and
    a charge generation layer between the first light-emitting stack and the second light-emitting stack.

5. The organic light-emitting device of claim 1, wherein the second organic light emitting layer is configured to emit red light.

6. The organic light-emitting device of claim 1, wherein an amount of a first dopant material doped into the first organic light emitting layer is larger than an amount of a second dopant material doped into the second organic light emitting layer, and
  wherein a weight ratio of the first dopant material doped into the first organic light emitting layer ranges from approximately 10% to 20%.

7. The organic light-emitting device of claim 6, wherein a weight ratio of the second dopant material doped into the second organic light emitting layer ranges from approximately 2% to 4%.

8. The organic light-emitting device of claim 1, wherein a thickness of the second organic light emitting layer ranges from approximately 50 Å to 150 Å.

9. The organic light-emitting device of claim 1, wherein a thickness of the first organic light emitting layer is larger than a thickness of the second organic light emitting layer, and ranges from approximately 100 Å to 500 Å.

10. The organic light-emitting device of claim 1, further comprising:
  an auxiliary electron transport layer on the first organic light emitting layer and the first electron transport layer, and including no second material,
  wherein a highest occupied molecular orbitals (HOMO) energy level of the first electron transport layer is lower than a HOMO energy level of the second organic light emitting layer such that holes do not move from the second organic light emitting layer beyond the first electron transport layer.

* * * * *